(12) United States Patent
Tate et al.

(10) Patent No.: US 11,874,736 B2
(45) Date of Patent: Jan. 16, 2024

(54) CALCULATING SOFT METRICS DEPENDING ON THRESHOLD VOLTAGES OF MEMORY CELLS IN MULTIPLE NEIGHBOR WORD LINES

(71) Applicant: APPLE INC., Cupertino, CA (US)

(72) Inventors: Yonathan Tate, Kfar Saba (IL); Nir Tishbi, Kfar Saba (IL)

(73) Assignee: APPLE INC., Cupertino, CA (US)

( * ) Notice: Subject to any disclaimer, the term of this patent is extended or adjusted under 35 U.S.C. 154(b) by 296 days.

(21) Appl. No.: 17/399,081

(22) Filed: Aug. 11, 2021

(65) Prior Publication Data

US 2023/0052685 A1 Feb. 16, 2023

(51) Int. Cl.
| | |
|---|---|
| G06F 11/00 | (2006.01) |
| G06F 11/10 | (2006.01) |
| G11C 29/52 | (2006.01) |
| H03M 13/45 | (2006.01) |
| G11C 16/04 | (2006.01) |

(52) U.S. Cl.
CPC .......... *G06F 11/1068* (2013.01); *G11C 16/04* (2013.01); *G11C 29/52* (2013.01); *H03M 13/45* (2013.01)

(58) Field of Classification Search
CPC ......... G06F 11/1068; G06F 2212/1032; G11C 29/88
USPC ....................................................... 714/1–57
See application file for complete search history.

(56) References Cited

U.S. PATENT DOCUMENTS

| | | | | |
|---|---|---|---|---|
| 7,133,853 | B2 * | 11/2006 | Richardson | ....... H03M 13/6362 706/15 |
| 8,099,652 | B1 | 1/2012 | Alrod et al. | |
| 8,429,498 | B1 | 4/2013 | Anholt et al. | |
| 8,572,443 | B2 | 10/2013 | Hetzler et al. | |
| 8,689,084 | B1 * | 4/2014 | Tai | ...................... H03M 13/658 714/24 |
| 8,854,880 | B2 | 10/2014 | Chen et al. | |

(Continued)

OTHER PUBLICATIONS

Luo et al., "Architectural Techniques for Improving NAND Flash Memory Reliability", CMU-CS-18-101, Thesis submitted in partial fulfillment of the requirements for the degree of Doctor of Philosophy, School of Computer Science, Carnegie Mellon University, pp. 1-263, Aug. 12, 2018.

(Continued)

*Primary Examiner* — Sarai E Butler
(74) *Attorney, Agent, or Firm* — Kligler & Associates Patent Attorneys Ltd.

(57) ABSTRACT

A memory controller includes an interface and a processor. The interface communicates with memory cells organized in multiple Word Lines (WLs). The processor is configured to read a Code Word (CW) of an Error Correction Code (ECC) from a group of multiple memory cells belonging to a target WL, to calculate for a given memory cell (i) a first soft metric, depending on a first threshold voltage of a first neighbor memory cell in a first WL neighboring the target WL, and (ii) a second soft metric, depending on a second threshold voltage of a second neighbor memory cell in a second WL neighboring the target WL, to calculate a combined soft metric based on both the first and second soft metrics and assign the combined soft metric to the given memory cell, and to decode the CW based on the combined soft metric, to produce a decoded CW.

20 Claims, 5 Drawing Sheets

(56) References Cited

U.S. PATENT DOCUMENTS

| | | | |
|---|---|---|---|
| 9,043,659 B2* | 5/2015 | Herrero Abellanas | ..................... G06F 11/008 714/47.1 |
| 9,483,347 B2 | 11/2016 | Wu et al. | |
| 9,489,257 B2 | 11/2016 | Ish-Shalom et al. | |
| 9,490,023 B2 | 11/2016 | Sommer et al. | |
| 10,340,951 B2 | 7/2019 | Symons et al. | |
| 10,388,394 B2 | 8/2019 | Tate et al. | |
| 10,884,855 B1 | 1/2021 | Yazovitsky et al. | |
| 10,929,221 B2 | 2/2021 | Haratsch et al. | |
| 11,205,498 B1* | 12/2021 | Berman | ................... G11C 7/06 |
| 2003/0184457 A1* | 10/2003 | Hsiun | .................... H04N 9/641 375/E7.199 |
| 2006/0291322 A1* | 12/2006 | Crippa | .................... G11C 7/04 365/230.06 |
| 2008/0313493 A1* | 12/2008 | Roohparvar | ........ G06F 11/2053 714/47.2 |
| 2011/0038212 A1* | 2/2011 | Uchikawa | ........... G11C 11/5642 365/185.18 |
| 2011/0066902 A1 | 3/2011 | Sharon et al. | |
| 2012/0151247 A1* | 6/2012 | Ferraiolo | ................ H04L 45/22 714/E11.079 |
| 2013/0159766 A1* | 6/2013 | D'Abreu | ............. G06F 12/0246 714/E11.089 |
| 2013/0326284 A1* | 12/2013 | Losh | ................... G06F 11/2053 714/47.2 |
| 2014/0157086 A1* | 6/2014 | Sharon | .................... G06F 12/14 711/163 |
| 2014/0223260 A1 | 8/2014 | Asadi et al. | |
| 2014/0281800 A1 | 9/2014 | Micheloni et al. | |
| 2015/0364189 A1* | 12/2015 | Mittelholzer | ........... G11C 11/56 365/163 |
| 2015/0364202 A1 | 12/2015 | Karakulak et al. | |
| 2017/0212801 A1* | 7/2017 | Tai | ......................... G06F 3/061 |
| 2018/0349044 A1 | 12/2018 | Baum et al. | |

OTHER PUBLICATIONS

Luo et al., "Improving 3D NAND Flash Memory Lifetime by Tolerating Early Retention Loss and Process Variation", ACM on Measurement and Analysis of Computing Systems, vol. 2, issue 3, pp. 1-48, Dec. 2018.

* cited by examiner

CALCULATING SOFT METRICS DEPENDING ON THRESHOLD VOLTAGES OF MEMORY CELLS IN MULTIPLE NEIGHBOR WORD LINES

TECHNICAL FIELD

Embodiments described herein relate generally to data storage, and particularly to methods and systems for decoding data retrieved from memory using a soft metric that depends on disturbances from memory cells belonging to multiple neighbor word lines.

BACKGROUND

In a memory device, memory cells of a given word line may be affected by memory cells in one or more neighbor word lines. Methods that consider interference from neighbor memory cells are known in the art. For example, U.S. Pat. No. 8,854,880 describes Inter-cell interference cancellation for flash memory devices. Data from a flash memory device is processed by obtaining one or more quantized threshold voltage values for at least one target cell of the flash memory device; obtaining one or more hard decision read values for at least one aggressor cell of the target cell; determining an aggressor state of the at least one aggressor cell; determining an interference amount based on the aggressor state; determining an adjustment to the quantized threshold voltage values based on the determined interference amount; and adjusting the quantized threshold voltage values based on the determined adjustment.

U.S. Pat. No. 9,489,257 describes a method for data storage that includes reading storage values, which represent stored data, from a group of memory cells using read thresholds, and deriving respective soft reliability metrics for the storage values. The storage values are classified into two or more subgroups based on a predefined classification criterion. Independently within each subgroup, a subgroup-specific distribution of the storage values in the subgroup is estimated, and the soft reliability metrics of the storage values in the subgroup are corrected based on the subgroup-specific distribution. The stored data is decoded using the corrected soft reliability metrics.

SUMMARY

An embodiment that is described herein provides a memory controller that includes an interface and a processor. The interface is configured to communicate with a plurality of memory cells organized in multiple Word Lines (WLs). The processor is configured to read a Code Word (CW) of an Error Correction Code (ECC) from a group of multiple memory cells belonging to a target WL, to calculate for a given memory cell in the group, (i) a first soft metric, depending on a first threshold voltage of a first neighbor memory cell in a first WL neighboring the target WL, and (ii) a second soft metric, depending on a second threshold voltage of a second neighbor memory cell in a second WL neighboring the target WL, to calculate a combined soft metric based on both the first soft metric and the second soft metric and assign the combined soft metric to the given memory cell, and to decode the CW based at least on the combined soft metric, to produce a decoded CW.

In some embodiments, in response to identifying that the decoded CW contains one or more errors, the processor is configured to perform a subsequent decoding iteration. In other embodiments, the processor is configured to use hard decision bits of the decoded CW as an updated input CW for the subsequent decoding iteration. In yet other embodiments, in performing the decoding iteration, the processor is configured to calculate an updated first soft metric and an updated second soft metric based on the decoded CW, to calculate from the first and second updated soft metrics an updated combined soft metric, and to re-decode the decoded CW using the updated combined soft metric.

In an embodiment, the processor is configured to select a subgroup of the memory cells in the group, whose threshold voltages belong to a zone between two read thresholds, and whose neighbor cells in the first WL have threshold voltages in a selected range, to estimate first and second Gaussian distributions of threshold voltages corresponding to the memory cells in the subgroup, and to derive the first soft metric based on the first and second Gaussian distributions. In another embodiment, the processor is configured to evaluate first and second counts of the memory cells in the subgroup, that belong respectively to the first and second Gaussian distributions, and to (i) estimate the first Gaussian distribution based at least on the first count and (ii) estimate the second Gaussian distribution based at least on the second count. In yet another embodiment, the processor is configured to identify in the group of the memory cells, locations corresponding to the memory cells in the subgroup, and to evaluate the first and second counts by respectively evaluating, in the identified locations of a base CW, a first number of '0' valued bits and a second number of '1' valued bits.

In some embodiments, the base CW includes a decoded CW that contains one or more errors, and that was produced in a decoding iteration. In other embodiments, the processor is configured to calculate the combined soft metric for the given memory cell by subtracting from a sum of the first soft metric and the second soft metric, an element that does not depend on the first and second threshold voltages.

There is additionally provided, in accordance with an embodiment that is described herein, a method for data storage, including, in a memory controller that communicates with a plurality of memory cells organized in multiple Word Lines (WLs), reading a Code Word (CW) of an Error Correction Code (ECC) from a group of multiple memory cells belonging to a target WL. For a given memory cell in the group, (i) a first soft metric is calculated depending on a first threshold voltage of a first neighbor memory cell in a first WL neighboring the target WL, and (ii) a second soft metric is calculated depending on a second threshold voltage of a second neighbor memory cell in a second WL neighboring the target WL. A combined soft metric is calculated based on both the first soft metric and the second soft metric, and the combined soft metric is assigned to the given memory cell. The CW is decoded based at least on the combined soft metric, to produce a decoded CW.

There is additionally provided, in accordance with an embodiment that is described herein, a storage system, including a nonvolatile memory and a memory controller. The nonvolatile memory includes a plurality of memory cells organized in multiple Word Lines (WLs). The memory controller is configured to read a Code Word (CW) of an Error Correction Code (ECC) from a group of multiple memory cells belonging to a target WL, to calculate for a given memory cell in the group, (i) a first soft metric, depending on a first threshold voltage of a first neighbor memory cell in a first WL neighboring the target WL, and (ii) a second soft metric, depending on a second threshold voltage of a second neighbor memory cell in a second WL neighboring the target WL, to calculate a combined soft metric based on both the first soft metric and the second soft metric, and assign the combined soft metric to the given memory cell, and to decode the CW based at least on the combined soft metric, to produce a decoded CW.

These and other embodiments will be more fully understood from the following detailed description of the embodiments thereof, taken together with the drawings in which:

DETAILED DESCRIPTION OF EMBODIMENTS

Overview

Embodiments that are described herein, provide methods and systems for decoding data retrieved from memory, using soft metrics that depend on disturbances originating from memory cells belonging to multiple neighbor word lines.

In various memory systems, a memory controller stores data in a memory device that includes multiple memory cells. The memory cells are typically organized in Word Lines (WLs), and each memory cell stores data in one of multiple predefined programming levels. The threshold voltages of memory cells programmed to a common programming level are distributed in accordance with a certain voltage distribution.

Voltage distributions of adjacent programming levels may partially overlap. In case of overlap, a memory cell programed to one programming level may be erroneously read as programmed to the adjacent programming level.

Data read from the memory device may contain errors due to various reasons such as aging, environmental condition and disturbances caused by neighboring memory cells, to name a few. For reliable storage, the memory controller typically stores the data encoded using a suitable Error Correction Code (ECC) such as, for example, a Low Density Parity Check (LDPC) code. Upon reading, the memory controller decodes the encoded data to recover the pre-encoded data.

In some embodiments, the memory controller decodes the data using a suitable soft decoding scheme. To this end, the memory controller assigns to bits of the read data predetermined soft metrics such as, for example, Log-Likelihood Ratios (LLRs). On some occasions, however, e.g., under adverse environmental and operational conditions, soft decoding using predetermined soft metrics may fail.

As will be described below, in some disclosed embodiments, the memory controller uses dynamic soft metrics that are determined upon reading so as to improve decoding performance. Moreover, the dynamic soft metrics take into consideration disturbances from memory cells in multiple neighbor WLs. Disturbances of this sort may occur, for example, when the threshold voltage of a target memory cell in a target WL is affected by memory cells in other WLs. Moreover, the level of disturbance caused by a neighbor memory cell typically depends on the threshold voltage of that neighbor memory cell.

Methods for LLR estimation that take into consideration disturbances from neighbor memory cells in a single neighbor WL are described, for example, in a U.S. Pat. No. 10,884,855, whose disclosure is incorporated herein by reference. (In the event of any inconsistencies between any incorporated document and this document, it is intended that this document control.) In this cited U.S. Patent, separate LLRs are derived for different zones of threshold voltages and for different subgroups of a group of target memory cells from which a CW is read, the subgroups are associated with respective programming levels of the neighbor memory cells.

In general, a memory cell in a target WL may be affected by memory cells belonging to multiple neighbor WLs. For example, in a Two-Dimensional (2D) configuration, the memory cells in a target WL are expected to be disturbed mainly by memory cells in adjacent WLs below and above the target WL.

In principle, in order to consider disturbances from multiple neighbor WLs, subgroups corresponding to memory cells in multiple neighbor WL could be defined. The number of subgroups in this approach, however, grows exponentially with the number of disturbing WLs. Such a solution is typically impractical, mainly because (i) it requires high computational complexity, and (ii) the number of memory cells in the subgroups may be insufficient for reliable estimation of the soft metrics.

In the disclosed embodiments, in calculating soft metrics, the memory controller considers disturbances from memory cells in multiple neighbor WLs. To this end, the memory controller calculates separate soft metrics that each considers disturbances from a single WL and combines among the separate soft metrics. As a result, a combined soft metric takes into consideration disturbances form the multiple WLs. This approach provides a reliable and low-complexity soft metric that considers disturbances from multiple neighbor WLs.

Consider an embodiment of a memory controller that includes an interface and a processor. The interface communicates with a plurality of memory cells organized in multiple WLs, wherein an individual one of the plurality of the memory cells is configured to store data in multiple predefined programming levels. The processor is configured to read a Code Word (CW) of an Error Correction Code (ECC) from a group of multiple memory cells belonging to a target WL, and to calculate for a given memory cell in the group, (i) a first soft metric, depending on a first threshold voltage of a first neighbor memory cell in a first WL neighboring the target WL, and (ii) a second soft metric, depending on a second threshold voltage of a second neighbor memory cell in a second WL neighboring the target WL. The processor is further configured to calculate a combined soft metric based on both the first soft metric and the second soft metric, to assign the combined soft metric to the given memory cell, and to decode the CW based at least on the combined soft metric, to produce a decoded CW.

The threshold voltage of the neighbor memory cell belongs to a range of threshold voltages that typically contains the programming level to which the memory cell has been programmed.

In some embodiments, decoding even using the dynamic soft metrics fails. In such embodiments, in response to identifying that the decoded CW contains one or more errors, the processor performs a subsequent decoding iteration, e.g., using hard decision bits of the decoded CW as an updated input CW for the subsequent decoding iteration.

In performing a decoding iteration, the processor calculates an updated first soft metric and an updated second soft metric based on the decoded CW, calculates from the first and second updated soft metrics an updated combined soft metric, and re-decodes the decoded CW using the updated combined soft metric.

In some embodiments, the processor estimates the soft metrics from estimated voltage distributions of relevant adjacent programming levels. For example, the processor is configured to select a subgroup of the memory cells in the group whose threshold voltages belong to a zone between two read thresholds, and whose neighbor cells in the first WL have threshold voltages in a selected range, to estimate first and second Gaussian distributions of threshold voltages corresponding to the memory cells in the subgroup, and to derive the first soft metric based on the first and second Gaussian distributions.

In an embodiment, the processor is configured to evaluate first and second counts of the memory cells in the subgroup, that belong respectively to the first and second Gaussian distributions, and to (i) estimate the first Gaussian distribution based at least on the first count and (ii) estimate the second Gaussian distribution based at least on the second count.

To evaluate the first and second counts, the processor is configured to identify in the group of the memory cells, locations corresponding to the memory cells in the subgroup, and to evaluate the first and second counts by respectively evaluating, in the identified locations of a base CW, a first number of '0' valued bits and a second number of '1' valued bits. The base CW includes, for example, a decoded CW that contains one or more errors, and that was produced in a decoding iteration.

In an embodiment, the processor calculates the combined soft metric for the given memory cell by subtracting from a sum of the first soft metric and the second soft metric, an element that does not depend on the first and second threshold voltages.

In the disclosed techniques, separate soft metrics are calculated, wherein each soft metric depends on disturbances from memory cells in a respective WL. The soft metrics are combined to produce a combined soft metric that takes into consideration disturbances from multiple WLs. The complexity thus grows linearly with the number of neighbor WLs considered.

System Description

Figure 1:
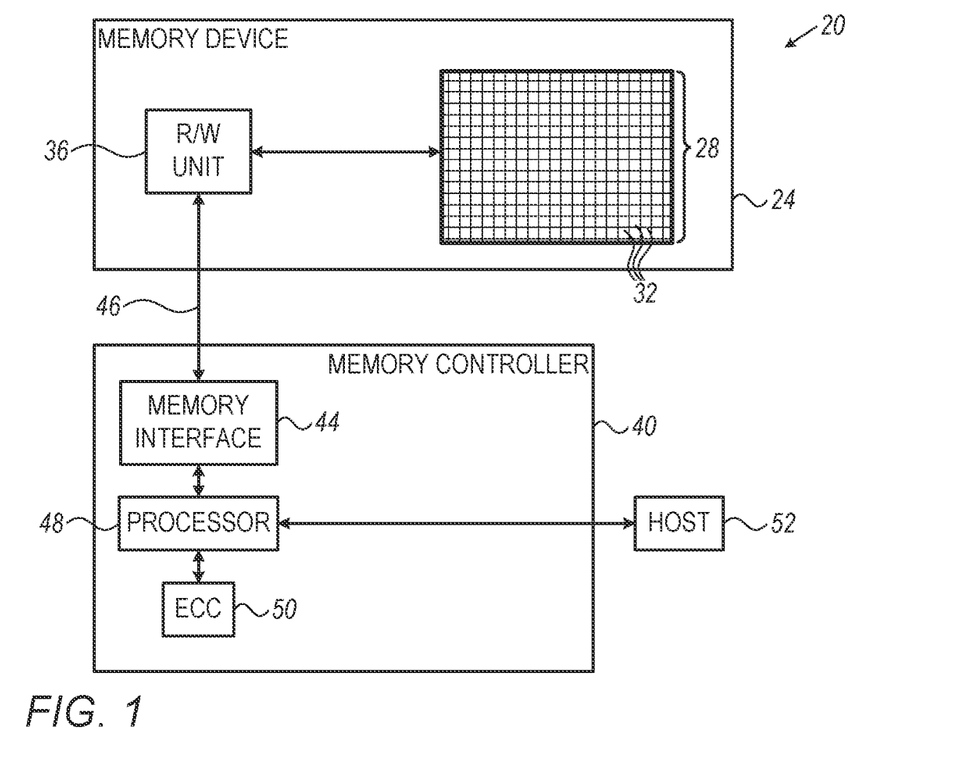
FIG. 1 is a block diagram that schematically illustrates a memory system, in accordance with an embodiment that is described herein.

FIG. 1 is a block diagram that schematically illustrates a memory system 20, in accordance with an embodiment that is described herein. Memory system 20 can be used in various host systems and devices, such as in computing devices, cellular phones or other communication terminals, removable memory modules, Solid State Disks (SSD), Secure Digital (SD) cards, Multi-Media Cards (MMC) and embedded MMC (eMMC), digital cameras, music and other media players and/or any other system or device in which data is stored and retrieved.

Memory system 20 includes a memory device 24, which stores data in a memory array 28 that includes multiple memory cells 32, such as analog memory cells. In the context of the present patent application, the term "analog memory cell" is used to describe any memory cell that holds a continuous, analog value of a physical parameter, such as an electrical voltage or charge. Memory array 28 may include solid-state memory cells 32 of any kind, such as, for example, NAND, NOR and Charge Trap Flash (CTF) Flash cells, phase change RAM (PRAM, also referred to as Phase Change Memory—PCM), Nitride Read Only Memory (NROM), Ferroelectric RAM (FRAM) or Resistive RAM (RRAM). Although the embodiments described herein refer mainly to analog memory, the disclosed techniques may also be used with various other memory types.

The charge levels stored in the memory cells and/or the analog voltages or currents written into and read out of the memory cells are referred to herein collectively as analog values, storage values or analog storage values. Although the embodiments described herein mainly address threshold voltages, the methods and systems described herein may be used with any other suitable kind of storage values.

Note that in the description that follows, the terms "analog values" and "threshold voltages" are used interchangeably.

Memory system 20 stores data in analog memory cells 32 by programming the memory cells to assume respective memory states, which are also referred to as programming levels. The programming levels are selected from a finite set of possible levels, and each programming level corresponds to a certain nominal storage value. For example, a 2 bit/cell Multi-Level Cell (MLC) can be programmed to assume one of four possible programming levels by writing one of four possible nominal storage values into the cell. Similarly, a 3 bit/cell MLC, also referred to as a Triple-Level Cell (TLC), and a 4 bit/cell MLC, also referred to as a Quad-Level Cell (QLC) device can be respectively programmed to assume one of eight possible programming levels and one of sixteen programming levels. A memory cell that stores a single bit (i.e., using two programming levels) is also referred to as a Single-Level Cell (SLC).

Memory device 24 includes a reading/writing (R/W) module 36, which converts data for storage in the memory device to analog storage values and writes them into memory cells 32. In alternative embodiments, the R/W module does not perform the conversion, but is provided with voltage samples, i.e., with the storage values for storage in the cells. When reading data out of memory array 28, R/W module 36 converts the storage values of memory cells 32 into digital samples having an integer resolution of one or more bits. Data is typically written to and read from the memory cells in data units that are referred to as data pages (or simply pages, for brevity).

For reading a data page, the R/W module typically sets one or more read thresholds, e.g., at about mid-points between adjacent nominal programming levels, and senses the threshold voltages of the memory cells relative to the read thresholds. The R/W module can also read the analog values of the memory cells in selected ranges or zones by setting the read thresholds to zone boundaries.

The storage and retrieval of data in and out of memory device 24 is performed by a memory controller 40. Memory controller 40 includes a memory interface 44 for communicating with memory device 24, a processor 48, and an Error Correction Code (ECC) module 50. The memory controller communicates with the memory device via memory interface 44 over a communication link 46. Communication link 46 may include any suitable link or communication bus, such as, for example, a PCIe bus. The disclosed techniques can be carried out by memory controller 40, by R/W module 36, or both. Thus, in the present context, memory controller 40 and R/W module 36 are referred to collectively as storage circuitry that carries out the disclosed techniques.

Memory controller 40 communicates with a host 52, for accepting data for storage in the memory device and for outputting data retrieved from the memory device. In some embodiments, ECC module 50 encodes the data for storage using a suitable ECC and decodes the ECC of data retrieved from the memory. ECC module 50 may include any suitable type of ECC, such as, for example, Low Density Parity Check (LDPC), Reed-Solomon (RS) or Bose-Chaudhuri-Hocquenghem (BCH), can be used. It should be noted, however, that embodiments that are described below that rely on calculating a syndrome weight refer mainly to codes that can be represented by a set of parity-check equations such as, for example, LDPC codes. Moreover, a good approximation of the number of errors from the syndrome weight is achieved for codes having a sparse parity-check matrix, such as, for example, LDPC codes.

Data read from a group of memory cells may contain one or more errors. The number of errors typically increases when the read threshold used for sensing the memory cells is positioned non-optimally. In some applications, the ECC supported by ECC module 50 can be represented by multiple parity-check equations.

In an embodiment, a syndrome vector that is indicative of the error pattern is generated by multiplying the readout data vector by the parity-check matrix of the ECC, e.g., using a hardware matrix-by-vector multiplier (not shown). Alternatively, other suitable methods for producing the syndrome vector can also be used. The weight of the syndrome vector, i.e., the number of the non-zero elements in the syndrome vector equals the number of unsatisfied parity-check equations. When the number of errors is relatively small, the syndrome weight is indicative of the number of errors in the code word. For example, for a code word having 4K bytes, and assuming the code rate equals 0.9, a valid number of errors may be estimated from the syndrome weight up to about 700 errors or less. In an embodiment, the syndrome vector includes binary elements, and the syndrome weight is calculated by summing the binary elements having a "1" value.

Memory controller 40 may be implemented in hardware, e.g., using one or more Application-Specific Integrated Circuits (ASICs) or Field-Programmable Gate Arrays (FPGAs). Alternatively, the memory controller may include a microprocessor that runs suitable software, or a combination of hardware and software elements.

The configuration of FIG. 1 is an example memory system configuration, which is shown purely for the sake of conceptual clarity. Any other suitable memory system configuration can also be used. For example, although the example of FIG. 1 shows a single memory device, in alternative embodiments memory controller 40 may control multiple memory devices 24, e.g., in a Redundant Array of Independent Disks (RAID) storage system. Elements that are not necessary for understanding the principles of the present disclosure, such as various interfaces, addressing circuits, timing and sequencing circuits and debugging circuits, have been omitted from the figure for clarity.

In the example memory system configuration shown in FIG. 1, memory device 24 and memory controller 40 are implemented as two separate Integrated Circuits (ICs). In alternative embodiments, however, the memory device and the memory controller may be integrated on separate semiconductor dies in a single Multi-Chip Package (MCP) or System on Chip (SoC), and may be interconnected by an internal bus. Further alternatively, some or all of the memory controller circuitry may reside on the same die on which the memory array is disposed. Further alternatively, some or all of the functionality of memory controller 40 can be implemented in software and carried out by a processor or other element of the host system. In some embodiments, host 52 and memory controller 40 may be fabricated on the same die, or on separate dies in the same device package.

In some embodiments, processor 48 of memory controller includes a general-purpose processor, which is programmed in software to carry out the functions described herein. The software may be downloaded to the processor in electronic form, over a network, for example, or it may, alternatively or additionally, be provided and/or stored on non-transitory tangible media, such as magnetic, optical, or electronic memory.

In an example configuration of memory array 28, memory cells 32 are arranged in multiple rows and columns, and each memory cell includes a floating-gate transistor. The gates of the transistors in each row are connected by word lines, and the sources of the transistors in each column are connected by bit lines. In the present context, the term "row" is used in the conventional sense to mean a group of memory cells that are fed by a common word line, and the term "column" means a group of memory cells fed by a common bit line. The terms "row" and "column" do not connote a certain physical orientation of the memory cells relative to the memory device. The memory array is typically divided into multiple memory pages, i.e., groups of memory cells that are programmed and read simultaneously.

In some embodiments, memory pages are sub-divided into sectors. Data pages may be mapped to word lines in various manners. Each word line may store one or more data pages. A given data page may be stored in all the memory cells of a word line, or in a subgroup of the memory cells (e.g., the odd-order or even-order memory cells). To access a specific word line or data page, the memory device is provided with a respective physical address.

Erasing of the memory cells in memory array 28 is usually carried out in blocks that contain multiple memory pages. Typical memory devices may include thousands of erasure blocks (also referred to as "memory blocks"). In a typical two-dimensional (2D) two-bit-per-cell MLC device, each erasure block is on the order of 128 word lines, each including several tens of thousands of memory cells. Two-bit-per-cell devices having 128 word lines per erasure block that store a data page per bit significance value would have 256 data pages per erasure block, and three-bit-per-cell devices would have 394 data pages per block. A typical three-dimensional (3D) device that stores three bits per cell may include, for example, 4 sections per block, wherein each section includes several thousand strings that each includes 48 layers of cell columns. Such a 3D device has 12 data pages per a physical word line, or 576 data pages per an erasure block. Alternatively, other block sizes and configurations can also be used.

Estimating LLRS Depending on Disturbances from Memory Cells of Multiple Neighbor Word Lines In various nonvolatile storage devices such as Flash NAND devices, neighbor memory cells may affect one another, e.g., due to mutual coupling. Consequently, the threshold voltage of a target memory cell may be shifted by a voltage-amount that depends on the threshold voltage of one or more neighbor memory cells. This in turn may result in increased number of errors in data retrieved from memory. In the disclosed embodiments, disturbances from memory cells in multiple neighbor WLs are taken into consideration in deriving soft metrics to be used in soft decoding, thus improving decoding performance.

Figure 2:
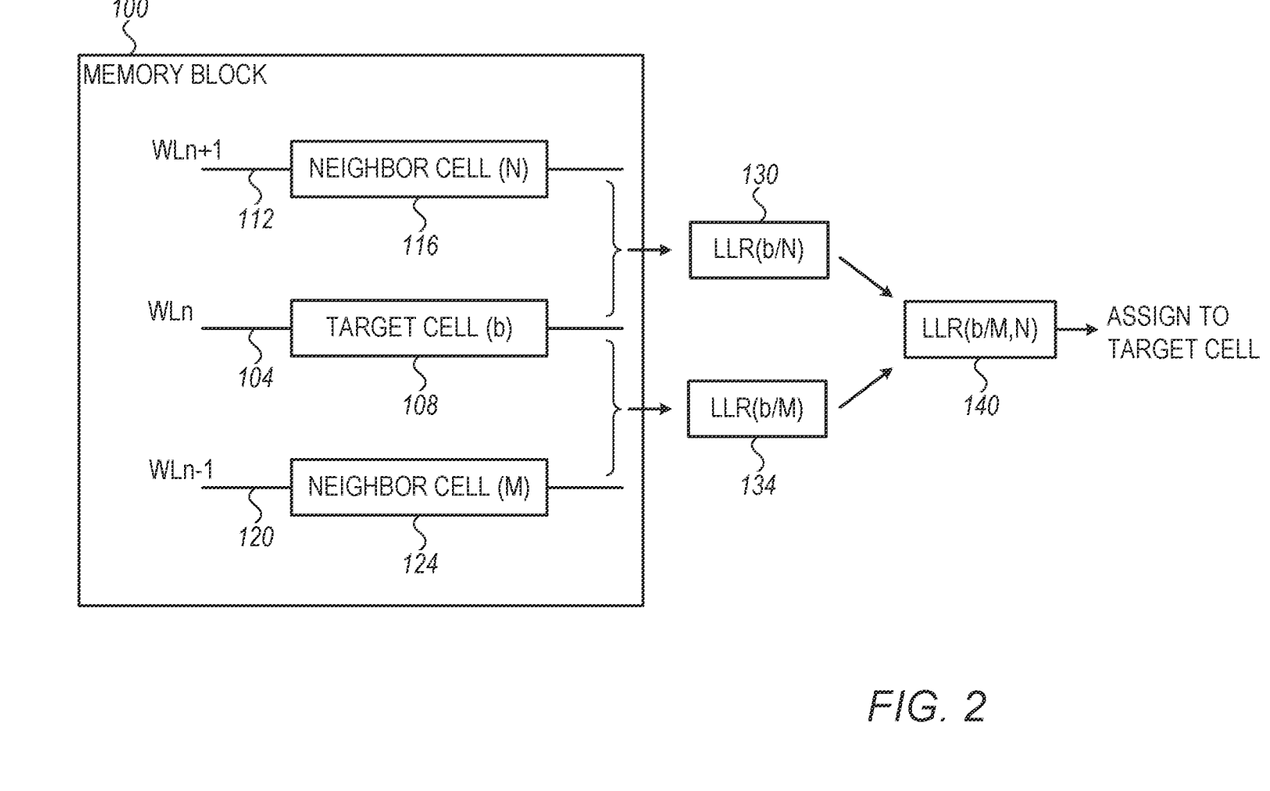
FIG. 2 is a diagram that schematically illustrates a method for estimating a Log Likelihood Ratio (LLR) metric that depends on disturbances originating from memory cells in multiple neighbor WLs, in accordance with an embodiment that is described herein.

FIG. 2 is a diagram that schematically illustrates a method for estimating a Log Likelihood Ratio (LLR) metric that depends on disturbances originating from memory cells in multiple neighbor WLs, in accordance with an embodiment that is described herein.

The methods described below for LLR estimation may be executed by processor 48 of memory controller 40.

FIG. 2 depicts three consecutive WLs in a memory block 100. A target WL 104 denoted WLn is the $n^{th}$ WL in the memory block. The target WL contains a target memory cell 108 to be assigned a respective LLR. An upper neighbor WL 112 in the memory block, denoted WLn+1, is an upper adjacent neighbor WL to the target WL. WLn+1 contains an upper neighbor memory cell 116. A lower neighbor WL 120 in the memory block, denoted WLn−1, is a lower adjacent neighbor WL to the target WL. WLn−1 contains a lower neighbor memory cell 124.

In the present example, target memory cell 108 experiences disturbances by both upper and lower neighbor memory cells 116 and 124. The purpose is to assign to the target memory cell a LLR that depends on disturbances contributed from both the upper and lower neighbor memory cells.

In some embodiments, processor 48 calculates an upper LLR 130 corresponding to a disturbance contributed by upper neighbor memory cell 116 alone, and further calculates a lower LLR 134 corresponding to a disturbance contributed by lower neighbor memory cell 124 alone. The upper LLR (130) and the lower LLR (134) are also denoted in the figure LLR(b/N) and LLR(b/M), respectively, wherein 'b' denotes the bit stored in target cell 108, 'N' denotes the upper neighbor memory cell and 'M' denotes the lower neighbor memory cell.

In an embodiment, the processor combines the separate LLRs 130 and 134 to produce a combined LLR 140 denoted LLR(b/N,M). The combined LLR corresponds to a common disturbance that the target cell experiences simultaneously from both the upper and lower neighbor memory cells.

In order to relate the combined LLR to the upper and lower LLRs, the probabilities Pr(b=0/N,M) and Pr(b=1/M, N) are required, as given in Equations 1 and 2.

$$Pr(b = 0/N, M) = \frac{Pr(b = 0/N) \cdot Pr(b = 0/M)}{Pr(b = 0)} \quad \text{Equation 1}$$

$$Pr(b = 1/N, M) = \frac{Pr(b = 1/N) \cdot Pr(b = 1/M)}{Pr(b = 1)} \quad \text{Equation 2}$$

It can be shown that based on the probabilities given in Equations 1 and 2, the combined LLR is given by:

LLR(b/N,M)=LLR(b/N)+LLR(b/M)−LLR(b)   Equation 3:

The element LLR(b) in Equation 3 is given by:

$$LLR(b) = \text{Log}\left[\frac{Pr(b = 0)}{Pr(b = 1)}\right] \quad \text{Equation 4}$$

In some embodiments, processor 48 calculates each of the expressions LLR(b/N) and LLR(b/M) in Equation 3, using methods described, for example, in U.S. Pat. No. 10,884,855 cited above.

In some embodiments, in subgroups of the memory cells, each subgroup corresponds to a zone between adjacent read thresholds and to memory cells that have threshold voltages in a selected range, processor 48 counts the numbers Nc(Si, b=0) and Nc(Si,b=1) of memory cells in the target WL having bit-values '0' or '1', wherein Si denotes the $i^{th}$ subgroup. The processor calculates the a-priori LLR(b) as, $$LLR(b) = \text{Log}\left[\frac{\sum_i Nc(Si, b = 0)}{\sum_i Nc(Si, b = 1)}\right] \quad \text{Equation 5}$$

In the example of FIG. 2, disturbances from two neighbor cells are considered. This configuration is not mandatory, and in other embodiments, combining more than two soft metrics can also be used. In such embodiments, Equation 3 is extended to combine more than two conditional LLRs. For example, for three neighbor cells denoted N, M and K Equation 3 would be modified to: LLR(b/N,M,K)=LLR (b/N)+LLR(b/M)+LLR (b/K)−2LLR(b).

In the example of FIG. 2, one neighbor memory cell is considered per each neighboring WL. In alternative embodiments, however, multiple disturbing memory cells belonging to a common neighbor WL can also be used.

A disturbing memory cell is typically assumed to reside in a WL adjacent to the target memory cells, because the level of disturbance is related to the physical distance from the target cell. Alternatively, neighbor memory cells in non-adjacent neighbor WLs may also be considered as memory cells that disturb the target memory cell. In a 2D configuration, a neighbor WL may reside above or below the target WL in a 2D memory block. In a Three-Dimensional (3D) configuration, a neighbor WL may also reside in a neighbor string of a 3D memory block.

Although the disturbing memory cell and the target memory cell typically belong to a common bit line, in other embodiments, a neighbor cell in another WL and another bit line may be considered as a disturbing memory cell.

Iterative Decoding Schemes with Combined LLRS

Figure 3:
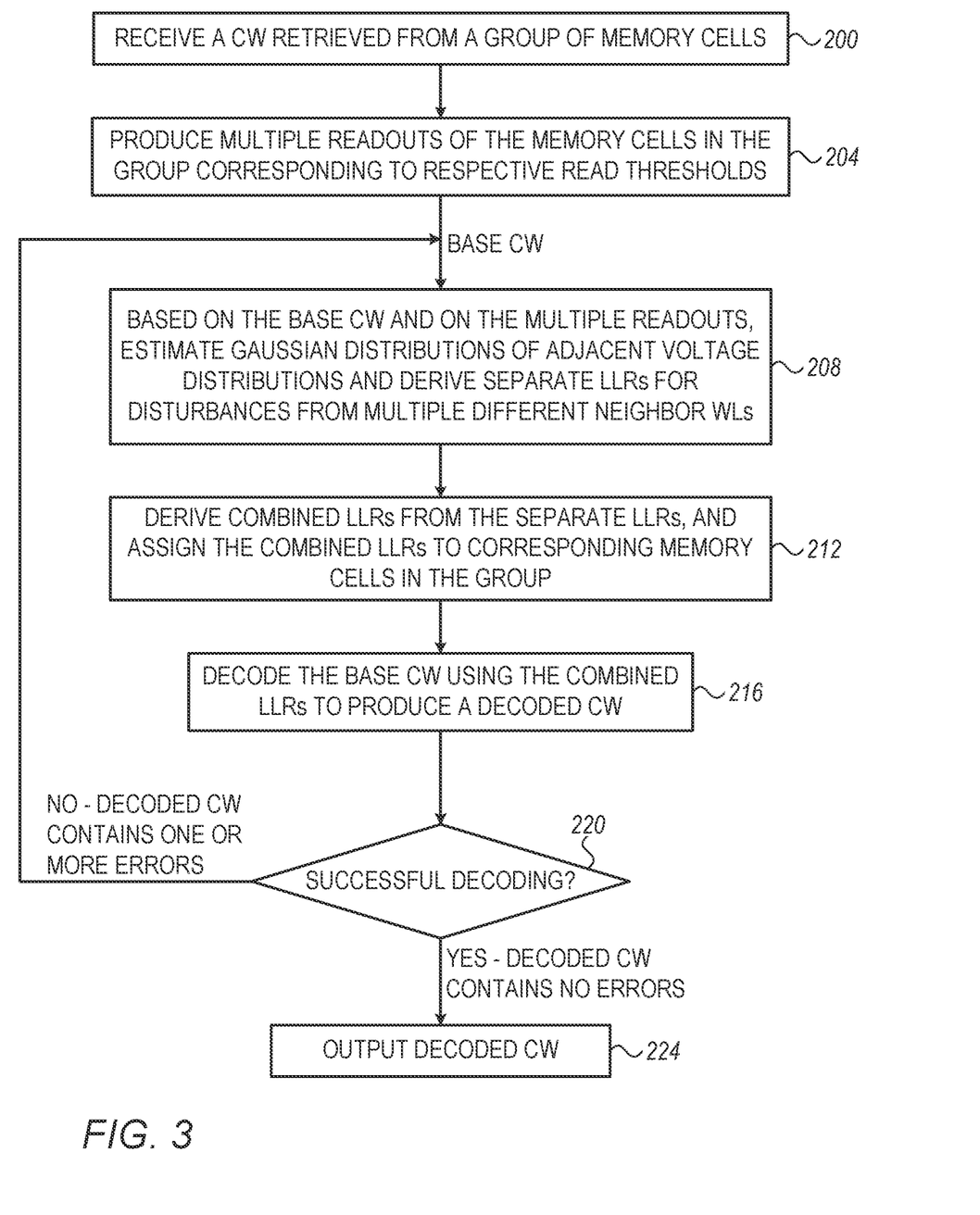
FIG. 3 is a flow chart that schematically illustrates a method for iterative decoding using combined LLRs, in accordance with an embodiment that is described herein.

FIG. 3 is a flow chart that schematically illustrates a method for iterative decoding using combined LLRs, in accordance with an embodiment that is described herein.

The method will be described as executed by processor 48 of memory controller 40.

The method begins at a reception stage 200 by processor 48 receiving a CW retrieved from a group of memory cells belonging to a target WL. At a multi-readout producing stage 204, the processor produces multiple readouts by reading the memory cells in the group using multiple respective read thresholds. The multiple read thresholds define zones between pairs of adjacent readouts. The received CW also serves as an initial base CW that may be updated across one or more decoding iterations, as will be described below.

At a distribution estimation stage 208, processor 48 estimates the voltage distributions corresponding to adjacent programming levels, based on the base CW and on the multiple readouts. In the present example, the processor models the voltage distributions as Gaussian distributions.

Alternatively or additionally, other suitable models of the voltage distributions can also be used.

In some embodiments, the processor estimates two Gaussian distributions for each pair of adjacent programming levels that have opposite bit encoding. For example, in reading the CW from a page of a certain bit-significance value (e.g., a LSB page), one of the adjacent programming levels encodes a '0' bit and the other encodes a '1' bit (as shown, for example, with reference to FIG. 4 below).

Further at stage 208, the processor derives separate LLRs for disturbances from multiple different neighbor WLs. Moreover, the processor estimates separate LLRs for different subgroups of the memory cells associated with neighbor memory cells having threshold voltages in respective selected ranges of the threshold voltages.

It should be noted, that at stage 208, the processor estimates the Gaussian distributions and derives the LLRs for each of neighbor WL separately. For example, assuming an upper neighbor WL and a lower neighbor WL, the processor derives first LLRs for the upper neighbor WL and separate second LLRs for the lower neighbor WL.

At a combined LLR derivation stage 212, processor 48 derives combined LLRs based on the separate LLRs of stage 208 and assigns the combined LLRs to corresponding memory cells in the group. In some embodiments, when considering disturbances from two neighbor WLs, the processor calculates the combined LLRs using Equations 3-5, above.

At a decoding stage 216, the processor decodes the ECC of the base CW by applying a suitable soft decoding scheme to the base CW, using the assigned combined LLRs. At a decoding status query stage 220, the processor checks whether the decoding at stage 216 has succeeded to produce an error free decoded CW, and if not, loops back to stage 208 to re-estimate the voltage distributions, wherein the decoded CW serves as an updated base CW for this decoding iteration. It should be noted that when the decoding at stage 216 fails, in some embodiments only hard decision data (bits of the decoded CW) are fed back and used as an updated base CW in the next decoding iteration.

When at stage 220 the decoded CW contains no errors, the processor outputs the decoded CW at an outputting stage 224, after which the method terminates.

In each decoding iteration, the decoded CW is expected to contain a smaller number of errors compared to the input base CW. Consequently, in the subsequent decoding iteration, the estimation of the Gaussian distributions is expected to improve, which results in enhanced LLRs and enhanced combined LLRs for improved decoding performance. The probability of successful decoding thus increases over the decoding iterations. The iterative decoding continues until converging to an error free decoded CW.

In the method of FIG. 3, the base CW is decoded using soft ECC decoding using estimated LLRs. In alternative embodiments, however, the base CW that is provided to the first iteration may be initially hard decoded, or soft decoded using predefined LLRs.

Efficient Estimation of Gaussian Distributions

As noted above, the processor estimates Gaussian distributions for multiple zones defined by multiple read thresholds. Moreover, the processor estimates two Gaussian distributions for each subgroup corresponding to memory cells in the zones having neighbor memory cells in a neighbor WL, whose threshold voltages belong to a selected range of threshold voltages. Estimation of a Gaussian distribution requires knowledge of the number of memory cells that belong to the Gaussian distribution over multiple zones.

Figure 4:
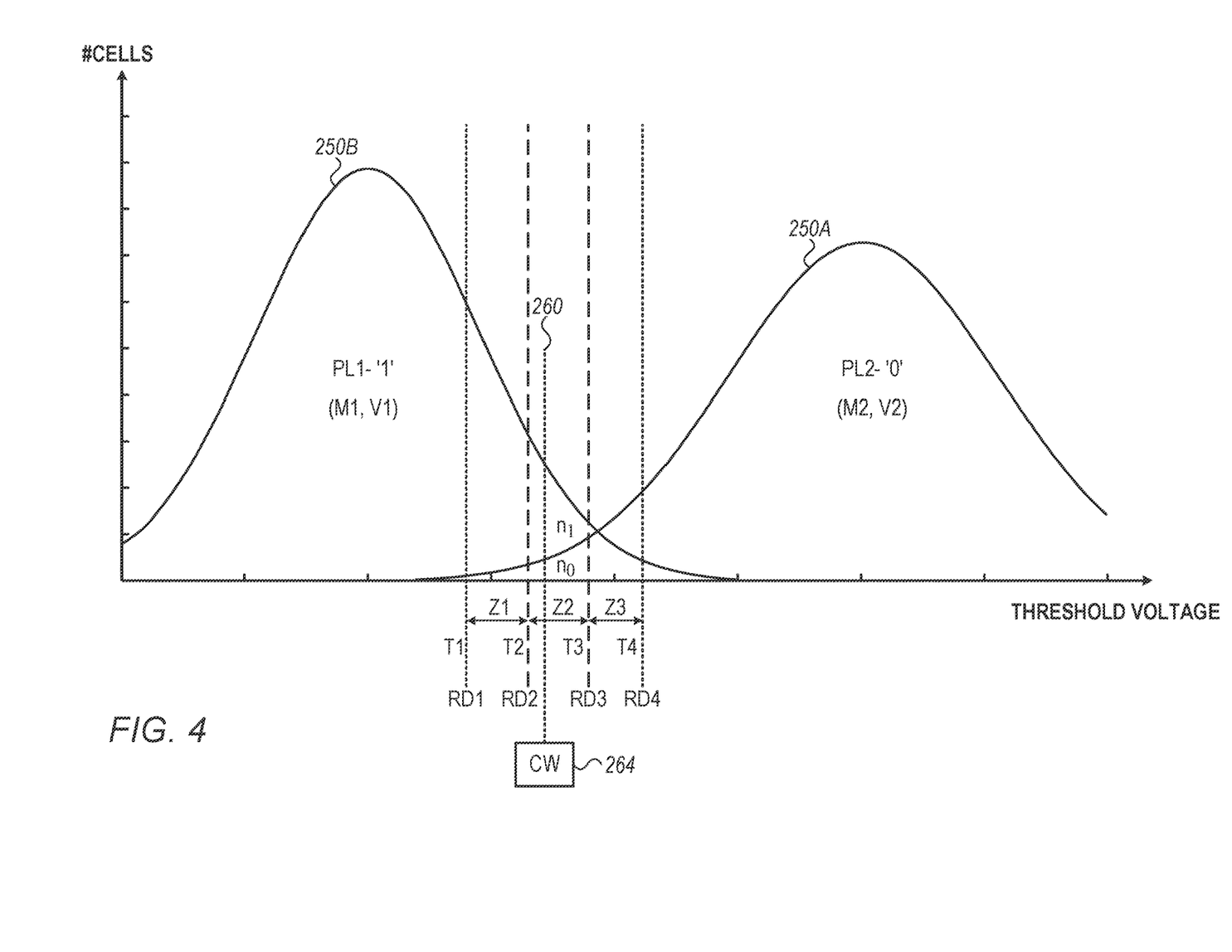
FIG. 4 is a diagram that schematically illustrates Gaussian distributions to be estimated based on cell-counts in zones of threshold voltages.

FIG. 4 is a diagram that schematically illustrates Gaussian distributions to be estimated based on cell-counts in zones of threshold voltages.

FIG. 4 depicts voltage distributions 250A and 250B to be modeled as Gaussian distributions. A Gaussian distribution is modeled using two parameters—a mean value parameter (denoted M) and a variance parameter denoted (V). In FIG. 4, the Gaussian parameters of voltage distributions 250A and 250B are denoted (M1,V1) and (M1,V2), respectively.

In FIG. 4, four read threshold voltages denoted T1 . . . T4 define three zones denoted Z1 . . . Z3. For example, zone Z2 spans between read thresholds T2 and T3.

Assuming the two Gaussian models (e.g., of distributions 250A and 250B) are known (e.g., estimated as will be described below), processor 48 may use the Gaussian models to estimate a LLR in a selected zone, by evaluating respective counts n0 and n1 of memory cells in that zone (and subgroup) that belong to the respective Gaussian models. Specifically, the processor derives n0 based on the Gaussian model of distribution 250A, and derives n1 based on the Gaussian model of distribution 250B. In an embodiment, the processor may calculate the LLR in the selected zone (and subgroup) as given by LLR=Log(n0/n1).

In some embodiments, processor 48 estimates a Gaussian model for distribution 250A by evaluating approximate values of n0 over multiple zones, and fitting a Gaussian model (M1,V1) to the multiple n0 counts across the multiple zones. Similarly, the processor estimates a Gaussian model for distribution 250B by evaluating approximate values of n1 in the multiple zones, and fitting a Gaussian model (M2,V2) to the multiple n1 counts over the multiple zones. The processor may use any suitable method for fitting the Gaussian model, e.g., by searching over a grid specifying possible pairs of the (M,V) parameters, or using some iterative method.

A method for evaluating n0 and n1 per zone (and subgroup) is now described. The method may be used for estimating Gaussian models during iterative decoding.

Let read threshold 260 denote the read threshold that was used for reading target CW 264 from a group of memory cells in the target WL. The decoded CW at the output of the ECC decoder in decoding iteration Ij (j>1) serves as a base CW in the subsequent decoding iteration Ij+1. Due to the decoding operation, the base CW in decoding iteration Ij+1 is expected to contain less errors than in decoding iteration Ij. In some embodiments, processor 48 estimates n0 and n1 in a zone (and subgroup) using the following stages:

Identify in the group of the memory cells, locations corresponding to the memory cells in the zone (and subgroup).

Examine bits at the identified locations of a base CW, and evaluate among the examined bits: n0 as the number of '0' valued bits and a n1 as the number of '1' valued bits, among the examined bits. The base CW includes a decoded CW that contains one or more errors.

Set n0 to the first number and n1 to the second number.

In some embodiments, before performing the first decoding iteration (no decoded CW is yet available), the base CW includes CW 264. In this case, memory cells whose threshold voltages fall above read threshold 260 are counted in n0, and memory cells whose threshold voltages fall to below read threshold 260 are counted in n1.

As noted above, to produce the Gaussian models, the processor needs to estimate the cell-counts n0 and n1 in each zone (and subgroup). To this end, the processor produces multiple readouts denoted RD1 . . . RD4 using the multiple read thresholds T1 . . . T4. The readouts are required for identifying the memory cells in the group belonging to the different zones.

The cell-counts n0 and n1 over multiple zones separate between the two Gaussian distributions. Across the decoding iterations, the cell-counts n0 and n1 are updated so as to better separate between the two Gaussian distributions. The overall number of memory cells in each zone and subgroup remains unmodified across the decoding iterations.

Performance of Iterative Decoding

Figure 5:
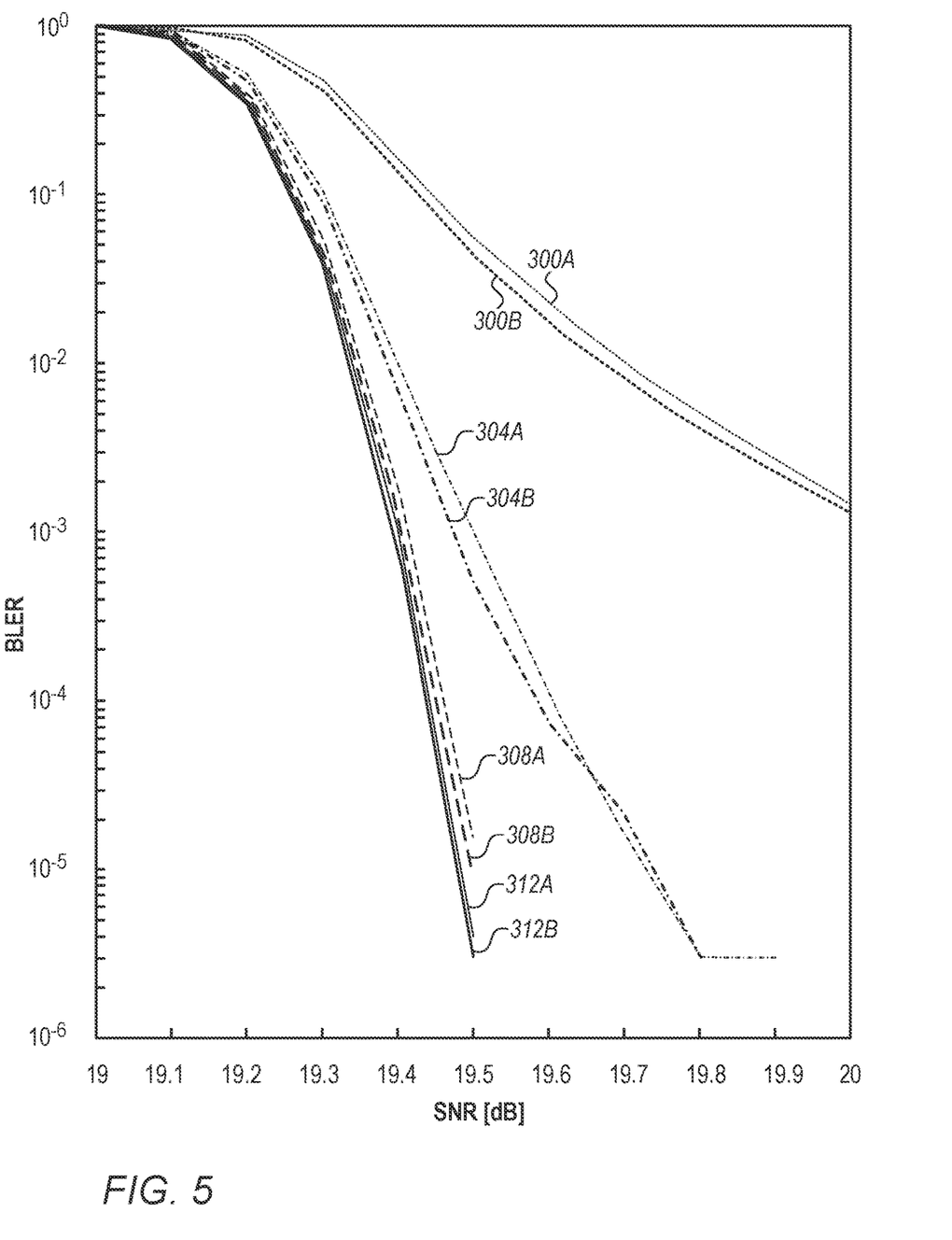
FIG. 5 is a diagram that schematically illustrates graphs of decoding failure rates using different numbers of decoding iterations, in accordance with an embodiment that is described herein.

FIG. 5 is a diagram that schematically illustrates graphs of decoding failure rates using different numbers of decoding iterations, in accordance with an embodiment that is described herein.

In FIG. 5, the horizontal axis corresponds to Signal-to-Noise (SNR) values in the range 19-20 dB. The vertical axis corresponds to Block Error Rate (BLER)—the probability of decoding failure.

The diagram depicts performance graphs as follows. The performance graphs were produced using computer simulations using combined LLRs that take into consideration disturbances from an upper and lower neighbor WLs, as described above. Graphs 300A, 304A, 308A and 312A correspond to iterative decoding with estimation of Gaussian distributions using the methods described above, for respective numbers of iterations 1, 2, 3 and 4. Graphs 300B, 304B, 308B and 312B correspond to iterative decoding with estimation of the Gaussian distributions using syndrome weights, for respective numbers of iterations 1, 2, 3 and 4. Methods for estimating Gaussian distributions using syndrome weights are described, for example, in U.S. Pat. No. 10,884,855 cited above.

As seen in the diagram, similar performance is achievable with and without using syndrome weights. The embodiments described above are advantageous compared to using syndrome weights, because they give comparable performance level at a significantly reduced computational complexity. As shown in the graphs, the decoding performance improves significantly with two and three decoding iterations compared to a single decoding iteration. On the other hand, in the present example, the fourth decoding iteration contributes little to the performance and therefore may be omitted to reduce decoding time and power consumption.

The embodiments described above are given by way of example, and other suitable embodiments can also be used. For example, although in the embodiments described above, voltage distributions of memory cells are mainly modeled based on Gaussian distributions, in other embodiments, any other suitable type of distribution can be also used for modeling the voltage distributions (instead of or in addition to the Gaussian distributions).

It will be appreciated that the embodiments described above are cited by way of example, and that the following claims are not limited to what has been particularly shown and described hereinabove. Rather, the scope includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. A memory controller, comprising: an interface, configured to communicate with a plurality of memory cells organized in multiple Word Lines (WLs); and a processor configured to: read a Code Word (CW) of an Error Correction Code (ECC) from a group of multiple memory cells belonging to a target WL; calculate for a given memory cell in the group, (i) a first soft metric indicative of a first reliability level assigned to the given memory cell depending on a first threshold voltage of a first neighbor memory cell in a first WL neighboring the target WL, and (ii) a second soft metric indicative of a second reliability level assigned to the given memory cell depending on a second threshold voltage of a second neighbor memory cell in a second WL neighboring the target WL; calculate a combined soft metric based on both the first soft metric indicative of a first reliability level assigned to the given memory cell depending on a first threshold voltage of a first neighbor memory cell in a first WL neighboring the target WL and the second soft metric indicative of a second reliability level assigned to the given memory cell depending on a second threshold voltage of a second neighbor memory cell in a second WL neighboring the target WL, and assign the combined soft metric to the given memory cell; and decode the CW based at least on the combined soft metric, to produce a decoded CW.

2. The memory controller according to claim 1, wherein in response to identifying that the decoded CW contains one or more errors, the processor is configured to perform a subsequent decoding iteration.

3. The memory controller according to claim 2, wherein the processor is configured to use hard decision bits of the decoded CW as an updated input CW for the subsequent decoding iteration.

4. The memory controller according to claim 2, wherein in performing the decoding iteration, the processor is configured to calculate an updated first soft metric and an updated second soft metric based on the decoded CW, to calculate from the first and second updated soft metrics an updated combined soft metric, and to re-decode the decoded CW using the updated combined soft metric.

5. The memory controller according to claim 1, wherein the processor is configured to select a subgroup of the memory cells in the group, whose threshold voltages belong to a zone between two read thresholds, and whose neighbor cells in the first WL have threshold voltages in a selected range, to estimate first and second Gaussian distributions of threshold voltages corresponding to the memory cells in the subgroup, and to derive the first soft metric based on the first and second Gaussian distributions.

6. The memory controller according to claim 5, wherein the processor is configured to evaluate first and second counts of the memory cells in the subgroup, that belong respectively to the first and second Gaussian distributions, and to (i) estimate the first Gaussian distribution based at least on the first count and (ii) estimate the second Gaussian distribution based at least on the second count.

7. The memory controller according to claim 6, wherein the processor is configured to identify in the group of the memory cells, locations corresponding to the memory cells in the subgroup, and to evaluate the first and second counts by respectively evaluating, in the identified locations of a base CW, a first number of '0' valued bits and a second number of '1' valued bits.

8. The memory controller according to claim 7, wherein the base CW comprises a decoded CW that contains one or more errors, and that was produced in a decoding iteration.

9. The memory controller according to claim 1, wherein the processor is configured to calculate the combined soft metric for the given memory cell by subtracting from a sum of the first soft metric and the second soft metric, an element that does not depend on the first and second threshold voltages.

10. A method for data storage, comprising: in a memory controller that communicates with a plurality of memory cells organized in multiple Word Lines (WLs), reading a Code Word (CW) of an Error Correction Code (ECC) from a group of multiple memory cells belonging to a target WL; calculating for a given memory cell in the group, (i) a first soft metric indicative of a first reliability level assigned to the given memory cell depending on a first threshold voltage of a first neighbor memory cell in a first WL neighboring the target WL, and (ii) a second soft metric indicative of a second reliability level assigned to the given memory cell depending on a second threshold voltage of a second neighbor memory cell in a second WL neighboring the target WL; calculating a combined soft metric based on both the first soft metric indicative of a first reliability level assigned to the given memory cell depending on a first threshold voltage of a first neighbor memory cell in a first WL neighboring the target WL and the second soft metric indicative of a second reliability level assigned to the given memory cell depending on a second threshold voltage of a second neighbor memory cell in a second WL neighboring the target WL, and assigning the combined soft metric to the given memory cell; and decoding the CW based at least on the combined soft metric, to produce a decoded CW.

11. The method according to claim 10, and comprising, in response to identifying that the decoded CW contains one or more errors, performing a subsequent decoding iteration.

12. The method according to claim 11, wherein performing the subsequent decoding iteration comprises using hard decision bits of the decoded CW as an updated input CW for the subsequent decoding iteration.

13. The method according to claim 11, wherein performing the decoding iteration comprises calculating an updated first soft metric and an updated second soft metric based on the decoded CW, calculating from the first and second updated soft metrics an updated combined soft metric, and re-decoding the decoded CW using the updated combined soft metric.

14. The method according to claim 10, wherein calculating the first soft metric comprises selecting a subgroup of the memory cells in the group, whose threshold voltages belong to a zone between two read thresholds, and whose neighbor cells in the first WL have threshold voltages in a selected range, estimating first and second Gaussian distributions of threshold voltages corresponding to the memory cells in the subgroup, and deriving the first soft metric based on the first and second Gaussian distributions.

15. The method according to claim 14, wherein estimating the first and second Gaussian distributions comprises evaluating first and second counts of the memory cells in the subgroup, that belong respectively to the first and second Gaussian distributions, and (i) estimating the first Gaussian distribution based at least on the first count and (ii) estimating the second Gaussian distribution based at least on the second count.

16. The method according to claim 15, wherein evaluating the first and second counts comprises identifying in the group of the memory cells, locations corresponding to the memory cells in the subgroup, and evaluating the first and second counts by respectively evaluating, in the identified locations of a base CW, a first number of '0' valued bits and a second number of '1' valued bits.

17. The method according to claim 16, wherein the base CW comprises a decoded CW that contains one or more errors, and that was produced in a decoding iteration.

18. The method according to claim 10, wherein calculating the combined soft metric for the given memory cell comprises subtracting from a sum of the first soft metric and the second soft metric, an element that does not depend on the first and second threshold voltages.

19. A storage system, comprising: a nonvolatile memory comprising a plurality of memory cells organized in multiple Word Lines (WLs); and a memory controller configured to: read a Code Word (CW) of an Error Correction Code (ECC) from a group of multiple memory cells belonging to a target WL; calculate for a given memory cell in the group, (i) a first soft metric indicative of a first reliability level assigned to the given memory cell depending on a first threshold voltage of a first neighbor memory cell in a first WL neighboring the target WL, and (ii) a second soft metric indicative of a second reliability level assigned to the given memory cell depending on a second threshold voltage of a second neighbor memory cell in a second WL neighboring the target WL; calculate a combined soft metric based on both the first soft metric indicative of a first reliability level assigned to the given memory cell depending on a first threshold voltage of a first neighbor memory cell in a first WL neighboring the target WL and the second soft metric indicative of a second reliability level assigned to the given memory cell depending on a second threshold voltage of a second neighbor memory cell in a second WL neighboring the target WL, and assign the combined soft metric to the given memory cell; and decode the CW based at least on the combined soft metric, to produce a decoded CW.

20. The storage system according to claim 19, wherein in response to identifying that the decoded CW contains one or more errors, the memory controller is configured to perform a subsequent decoding iteration.

* * * * *